United States Patent [19]

Sullivan

[11] 4,012,693
[45] Mar. 15, 1977

[54] PRINTED CIRCUIT BOARD TESTING

[76] Inventor: Donald F. Sullivan, 115 Cambridge Road, King of Prussia, Pa. 19406

[22] Filed: July 16, 1975

[21] Appl. No.: 596,303

[52] U.S. Cl. .............................. 324/73 PC; 29/593; 324/52

[51] Int. Cl.² .................. G01R 31/02; G01R 31/08

[58] Field of Search ............ 324/51, 52, 66, 73 PC, 324/158 P, 158 F; 29/593

[56] References Cited

UNITED STATES PATENTS

| | | | |
|---|---|---|---|
| 2,887,622 | 5/1959 | Rayburn et al. | 324/73 PC X |
| 3,501,698 | 3/1970 | Becknell | 324/51 X |
| 3,617,876 | 11/1971 | Robinson | 29/593 X |
| 3,723,867 | 3/1973 | Canarutto | 324/73 PC |

FOREIGN PATENTS OR APPLICATIONS

| | | | |
|---|---|---|---|
| 1,297,377 | 11/1972 | United Kingdom | 324/73 PC |

OTHER PUBLICATIONS

DeGroat et al., *Finding Shorts In Printed Circuit Boards* IBM Tech. Disclosure Bulletin vol. 12, No. 5, Oct. 1969, pp. 655, 666.

Dodd et al. *Printed–Circuit Tester* IBM Technical Disclosure Bulletin vol. 16, No. 9, Feb. 1974 pp. 2848, 2849.

*Primary Examiner*—Gerard R. Strecker
*Attorney, Agent, or Firm*—Laurence R. Brown

[57] ABSTRACT

A tester locates wiring defects such as short circuits between printed wires on a printed circuit board wiring pattern by registration with a mirror image pattern. To identify a particular defect location on the pattern, a test jig is prepared by placing a pattern of insulating material on a flexible conductive screen to be held a short distance away from the corresponding conductive pattern of the identical shape on the printed circuit board. By scanning the pattern with a roller forcing the two patterns into contact with each other, current is passed from the screen through the wiring board at any scan position where the conductive printed circuit board pattern exceeds its boundary limits or short circuits adjacent conductors. Provision is made to read automatically X and Y coordinate positions of a defect location into a register.

15 Claims, 3 Drawing Figures

PRINTED CIRCUIT BOARD TESTING

This invention relates to printed circuit wiring board testers, and more particularly it relates to testing equipment and methods for locating short circuits in printed circuit board patterns.

BACKGROUND OF THE INVENTION

Printed circuit wiring boards are conventionally made by etching and photographic processes using resist to define patterns in a conductive layer. If this resist breaks down or slight photographic or etching errors occur unwanted conductive patterns may appear between wanted conductive patterns. These may change circuit impedances such as capacitance and may cause arcing or short circuits between conductors. Intermittent types of short circuits are hard to locate with any conventional type of test equipment. Visual testing of printed circuit boards is used in the prior art to detect wiring pattern deviations, but such is unsatisfactory both in terms of cost and since some defects are difficult to detect visually and fatigue or physical condition of an inspector may affect test results. Accordingly, a completely reliable test method for locating short circuits and near short circuits has not been heretofore available.

Prior art attempts to mechanize testing of printed circuit wiring boards have been limited to spot checks of critical circuit locations or dynamic testing of circuit boards with connectors and/or components thereon, both of which materially increases the cost of locating defects and complicating any possible repairs. Even when defective patterns such as short circuits were located by mechanical or electrical tests, the location has not been identified specifically enough to facilitate repair and correction of the defect.

A further failure of prior art printed circuit board testers is complexity and unadaptability. If connectors need be affixed this makes the tests limited to known circuit pattern configurations and further is time consuming and awkward and introduces possibilities of errors in the connectors which are not usually made to withstand repeated connecting and disconnecting cycles over long periods of time.

OBJECTS OF THE INVENTION

It is therefore a general object of the invention to improve the state of the art in printed circuit board testing.

A more specific object of the invention is to provide simple and accurate test fixtures and methods for locating deviations from desired printed circuit wiring patterns.

Another object of the invention is to provide test fixtures and methods for precisely identifying defect locations upon printed circuit patterns to facilitate repair.

Still another object of the invention is to provide test fixtures and methods that can be used efficiently and effectively on a universal basis for different wiring patterns on printed circuit boards.

Additional objectives include low equipment and processing cost, complete testing accuracy and ability to locate near faults and defects that may cause intermittent failures.

SHORT DESCRIPTION

The foregoing and additional features, objects and advantages of the invention are realized by registration of a test jig having a mirror image pattern of the wiring board pattern thereon and determining conductivity between the jig and board. Thus, any circuit conductor extending beyond the desired wiring pattern is detected.

By spacing the two patterns slightly apart in pattern registration, the test procedure can scan along X or Y coordinates defined by a line produced by a cylindrical roller pressing the two patterns into physical contact so that conductivity between the two patterns may be sensed for identifiable coordinate positions precisely locating the defect for purpose of repair. The coordinate positions may be stored automatically in a register during the scan by flashing the coordinate position when conductivity is sensed.

THE DRAWING

Preferred embodiments of the invention are described with reference to the accompanying drawings, wherein.

THE TEST METHOD

Figure 1:
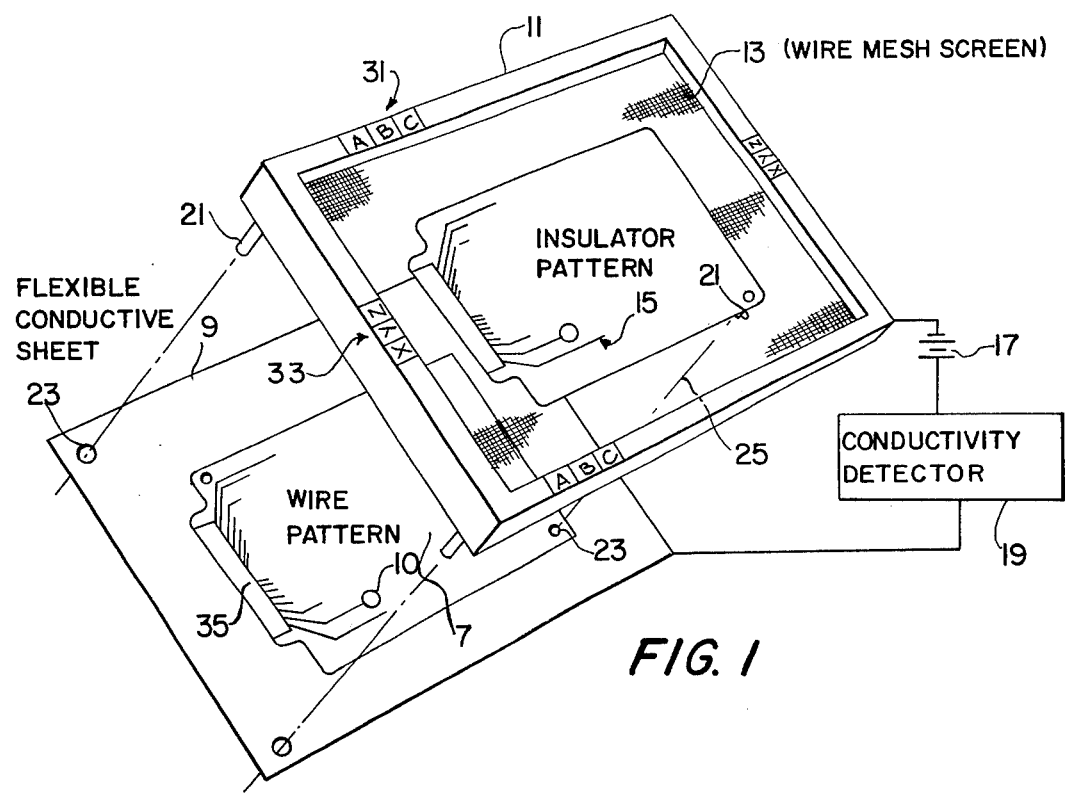
FIG. 1 is a top perspective view of a testing array provided by this invention.
Figure 2:
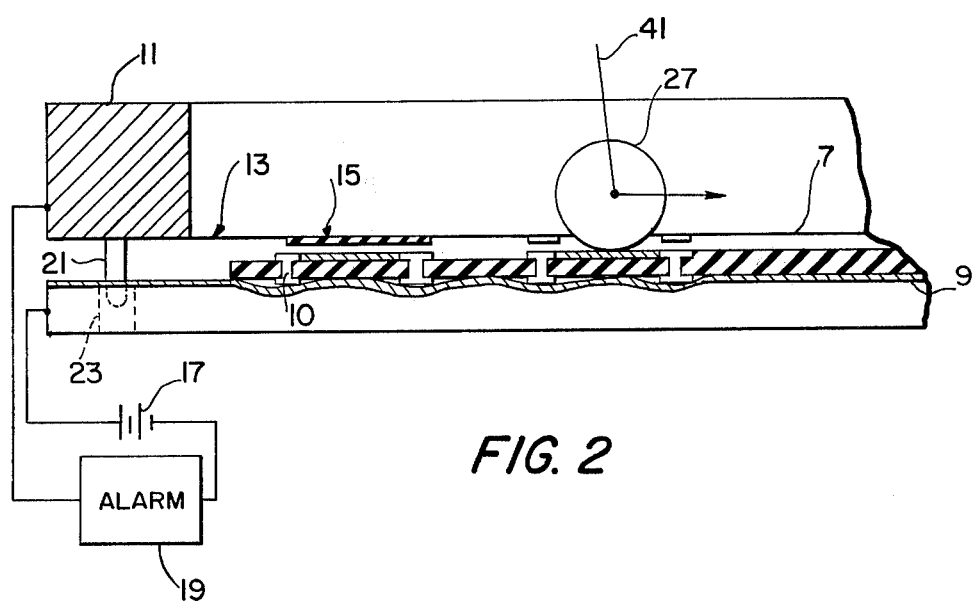
FIG. 2 is a side view, partially in section of a test equipment embodiment with schematic representation of a continuity testing circuit.

The procedure followed in testing printed circuit board wiring patterns may be understood by reference to FIGS. 1 and 2 of the drawing, where the printed circuit board 7 has the wire pattern to be tested face up on a conductive sheet 9. Means such as plated through eyelets 10 cause the wiring pattern to be conductively connected to the flexible conductive sheet 9 on the bottom side of the printed circuit board 7 which conforms to any irregularities in conductor terminals or wiring patterns on the bottom side of board 7.

A test jig 11 comprises a frame holding a fine wire mesh screen 13 which has inscribed therein an insulator pattern 15 identical to that desired on the wire pattern of the board under test 7. The test jig is carefully registered with the printed circuit board so that the insulation pattern flush with the conductive screen on the bottom of screen 13 can be placed in physical contact with the corresponding conductor pattern on the board under test 7. Then if the conductive pattern conforms exactly with the insulation pattern no conductive contact is made between jig 11 and conductive sheet 9. However, if a wire on board 7 is out of tolerance and fringes over the edge of the desired boundary established by the insulating pattern conductive contact will be made with wire mesh screen 13 and current will flow from battery 17 through the conductivity detector 19 indicating a defect in the board under test 7. The conductivity detector can actuate a lamp or other alarm device.

For purpose of registration, pins 21 may be used for example to register into receptacles 23 as indicated for example by dotted line 25.

While the entire printed circuit board 7 may be tested in entirety by matching contact with the test jig insulation pattern which is presented face to face in mirror image fashion, it is desirable to pinpoint the location of defects for purposes of repair. Thus, a cylindrical roller 27 may be used to scan the pattern along a contact line in either coordinate direction X, Y along the test board 7 wiring pattern. Thus, the surfaces of the test jig pattern 15 and board 7 are slightly separated and urged into physical contact by pressure on the roller 27.

Accordingly, as shown by grid coordinates 31, 33 a location of a defect may be noted along the Y axis (length) by designation of a coordinate 31 (A, B, C, etc.) whenever a continuity detection is made between jig 31 and conductive sheet 9 in response to a scanning cycle along the length of the board 7 by rolling roller 27. Similarly an X axis (width) coordinate may be identified.

It is to be recognized that the tolerances of detection of fringing faults may be modified by making the dimensions of the insulating pattern 15 on screen 13 slightly larger than the wire pattern on the board under test 7 to allow for edge effects and minor variations that would not cause a failure such as a short circuit, or an out of tolerance capacitance in the environment of the board in actual use.

Also it is clear that this method provides a simple inexpensive tester that can provide essentially 100% accuracy in testing of the entire wiring array without significant operational expense, and yet providing precise pinpointing of defect locations. Furthermore, out-of-tolerance conditions such as near-defects can be detected that could lead to intermittent failures in conditions of use, particularly when used in presence of dust or heat which could cause expansion of conductor surfaces. In addition the connector portion 35 of the test board under test is tested for defects whenever there is access to the conductive sheet by plated through eyelets 10 or by other means.

This test method may be used universally with any test board patterns as long as a corresponding mirror image test jig is made available conforming to the test board pattern to be tested.

THE TEST EQUIPMENT

Figure 3:
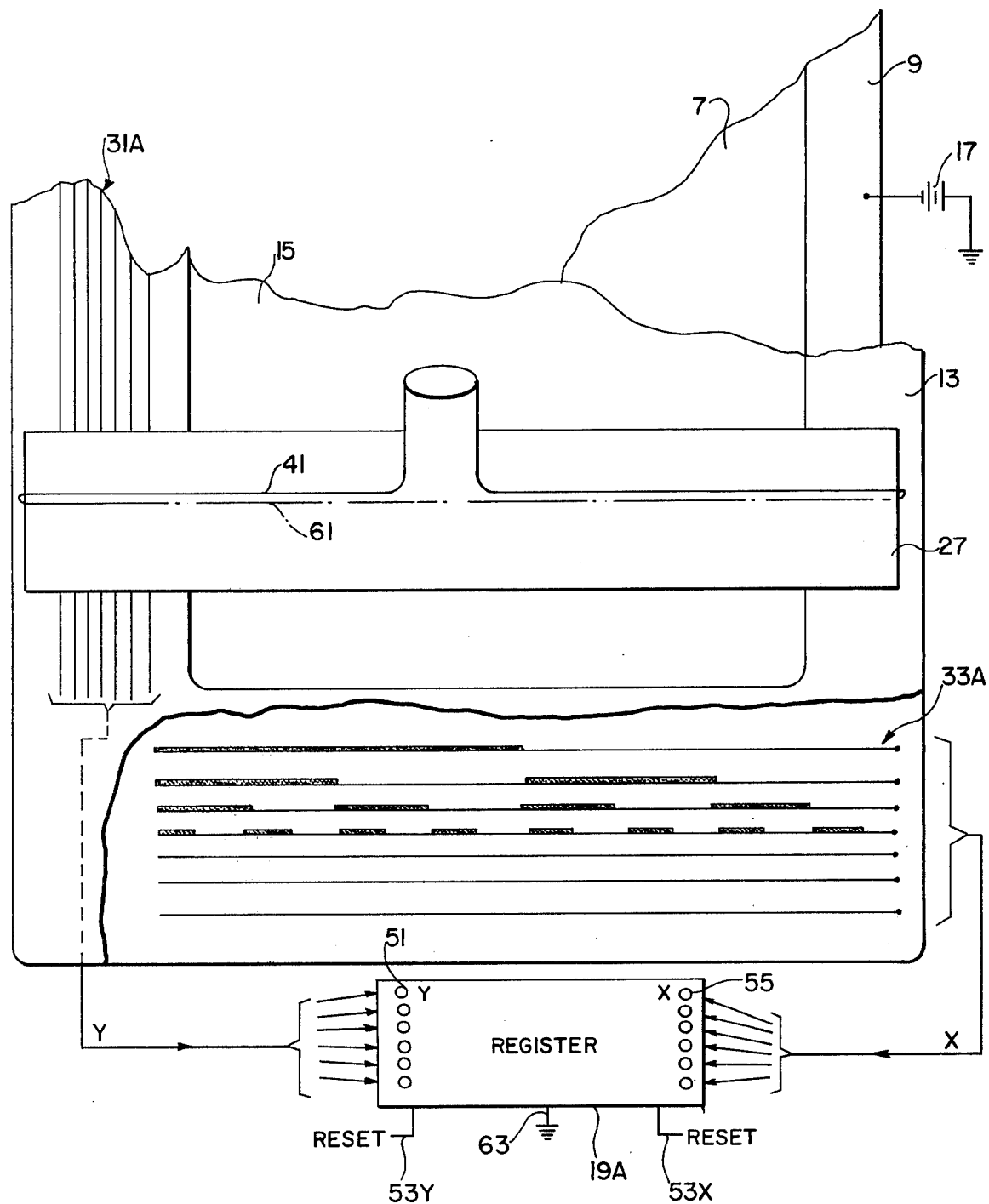
FIG. 3 is a broken away diagrammatic view of a further embodiment of the invention for locating the position of defects.

Although variations may be made to the equipment shown in the embodiments of FIGS. 1 to 3, these illustrations cover the basic techniques that provide simplified and therefore preferred test equipment embodiments, which can be expanded as desired for use in more complex systems for testing both sides of the circuit board 7 for automating feed, marking of defects or printing out board test results, etc.

The test jig can be manufactured by clamping a stainless steel mesh fabric commonly used in precision screen printing in a sturdy aluminum frame or the like. A mesh count in the order of 255 with a wire diameter of about 0.5 mm woven in a plain weave will suffice. Preferably the frame is conductive to clamp the screen at all four edges to assure electrical contact with all wires in the mesh.

The insulating circuit pattern is applied in a conventional fashion and may be a photo polymer such as polyvinyl alcohol (PVA) photosensitized with ammonium bichromate deposited on a thin plastic or paper carrier sheet to a thickness of the order of 0.5 mm. The process known as indirect stencil formation may be used to convert the sheet to the desired insulating pattern, where the stencil is formed off screen and is transferred to the metal fabric. Thus, the photosensitive emulsion on the carrier sheet is exposed to a high intensity light source through a photographic film carrying the desired pattern. Transparent film portions permits the light to harden the emulsion so that when developed the unhardened emulsion may be washed away leaving the test circuit pattern on the carrier sheet.

The emulsion is tacky before drying and therefore the screen can be forced down into the circuit pattern against the backing sheet, which can be peeled away after the emulsion dries. Thus, the emulsion becomes embedded in the screen fabric substantially flush with the screen surface and does not penetrate through to the opposite side of the screen. Thus, is desired a test pattern for the opposite side of the printed circuit board may be put on the opposite side of the screen fabric and the same test jig may be turned over or hinged at one edge for testing two board patterns.

The heretofore described screen is suitable for testing printed wiring boards having conductor spacings of about 5 mm or more. Normally conductors have a height above the board surface of about one mm. When the conductors are spaced closer than about 5 mm, considerable force would be necessary as applied to the scanning roller 27 to assure screen to laminate physical contact. For such dimensions and for reducing contact pressure a more flexible screen may be desirable.

Thus, a further screen embodiment can have a test pattern formed on a thin copper layer (in the order of 0.05 mm thick) resident on a thin sheet of polyester or polyamide (about ¾ mm thick). The copper layer may be on both sides. A plating resist pattern may be formed on the copper sheet corresponding to the printed wiring board conductor pattern. Then the copper sheet (between the printed circuit board conductors) may be plated up to a thickness of about ¾ mm so that exposed and raised copper fingers extending from the overall flexible copper sheet can probe between the conductors on the printed wiring board pattern with considerably less application pressure than for the stainless steel fabric.

The cylindrical roller 27 is preferably a rubber roller with a metal core for strengthening and a durometer magnitude of 50 to 55. Its diameter is of the order of 2.5 cm and its length is slightly greater than the corresponding dimension (length or width) of the circuit board under test. It can use the frame 31 edges for guidance along the scanning stroke, and has an operating yoke 41 for manual use. A squeegee could alternatively be used.

It is important to make the conductive sheet 9 flexible in order to conform with irregularities on the board surface due to solder plating thickness variations and crowning effects and make positive conductive contact with all conductive surfaces. The conductive screen can be simply the beforementioned steel fabric mesh with a lowermost rubber lamination of a thickness of about 10 mm. If it is desired to test boards without plated through eyelets 10, then a metal carpet structure should replace the screen. This structure then will have vertical metal whiskers which will be passed through drilled holes in the insulating board and contact the edge of the topside conductors. The whisker length should equal the board thickness.

As a matter of fact the same test jig screen may be used in one step to print the plating resist on the printed wiring board and in another step for testing for board defects.

AUTOMATIC REGISTRATION OF DEFECT LOCATION

In the FIG. 3 sketch like reference characters are used to relate similar parts to the other Figures, with designations A referring to modified forms of the circuit elements.

Thus, roller 27 is adapted for manual scanning by handle 41 to contact board 7 with insulators 15 on screen 13 in either X or Y axis directions. As shown in the Y axis scanning direction, the roller will contact with conductive screen 13 an array 31A of coded numbers such as seven binary digits represented by linear notation. Therefore, depending upon the number of bits used the definition of the array can closely locate a defect coordinate position when encountered in the form of a binary address code that may be entered in the Y register in continuity detector 19A. A separate indicator 51 such as a lamp lit or flag positioned by a latching relay or equivalent electronic circuit may be stored until reset at input 53. The X axis configuration operates similarly and for illustration a four bit binary code array is shown by the thick-thin lines of indicia means 33A. In such case only four indicators 55 would be necessary for the X axis register.

In operation a continuity circuit may be traced through the test array so that current from the battery 17 will register appropriate indicators 51, 55 at a defect location. Assume the roller locates a defect at contact line 61 shown in phantom view. This causes screen contact with each of the seven binary coded lines of indicia array 31A that may be conductors. These lines as shown at 33A may be linear wire conductors having insulator coating overlays so that the contact position will be read out in binary code by the ones of the lines through which current flows from screen 13 through register 19A indicators 51 and ground lead 63 back through the battery 17 to flexible conductor sheet 9 through the board 7 defect into the screen 13. Accordingly, this embodiment provides a simple means of registering the exact position of a defect found by scanning the circuit board in the X and Y coordinates with roller 27.

Having therefore described these embodiments of the invention, the spirit and nature of the novel features thereof is set forth with particularity in the appended claims.

What is claimed is:

1. The method of locating wiring defects on printed circuit wiring board patterns having conductive wires affixed to an insulating board, comprising the steps of, providing a mirror image test jig of the wiring pattern with insulating materials located in locations corresponding to conductive locations on said board and conductive materials placed in positions corresponding to the insulating locations on said board, registering in physical contact the test jig pattern with the corresponding wiring board pattern, and sensing conductivity between the test jig and wiring board while in contact to identify wiring defects.

2. The method defined in claim 1, wherein the registering step physically contacts said board at a predetermined limited region and includes the additional step of scanning the contact position over the entire board surface.

3. The method defined in claim 2, wherein the scanning step is provided by urging said test jig and wiring board in contact with a cylindrical roller.

4. The method defined in claim 2 including the step of identifying the scanning location when a wiring defect is sensed.

5. The method defined in claim 3, wherein the scanning step is taken along two intersecting coordinates and the scanning location of each coordinate is registered in response to sensing of a wiring defect.

6. The method defined in claim 1 including the step of printing wiring pattern on the printed circuit wiring board with the insulator pattern of the test jig.

7. Test equipment for locating wiring defects on a printed circuit wiring board having a conductive wire pattern affixed to an insulating board, comprising in combination,
   a test jig with a mirror image of the wiring pattern on said board defined by insulating materials located in place of the conductive patterns and with conducting patterns located in place of the insulating portions,
   means placing in registration said test jig and said wiring board,
   means contacting in registration at least a portion of the test jig with a corresponding portion of the wiring board, and
   means sensing conductivity between the test jig and wiring board while in contact.

8. Test equipment as defined in claim 7, wherein said conductive pattern on said test jig comprises a wire mesh, and said insulating materials are affixed to said wire mesh.

9. Test equipment as defined in claim 8, wherein the insulating materials are affixed on the surface of said wire mesh and different wiring patterns are placed on opposite surfaces of the wire mesh.

10. Test equipment as defined in claim 7, wherein said means contacting said jig and board scans a sequence of contact locations on said board along at least one coordinate, and including means identifying the coordinate position of a defect when conductivity is sensed between the test jig and wiring board.

11. Test equipment as defined in claim 7, wherein the printed wiring board has punched hole therethrough, and said means sensing conductivity comprises a flexible surface having a conductor path in contact with the wiring pattern extending through said punched holes.

12. Test equipment as defined in claim 11, wherein said flexible conductive surface comprises a substantially flat wire mesh screen having a laminated rubber backing, and plated through eyelets are located in said punched holes.

13. Test equipment as defined in claim 7, wherein said means sensing conductivity consists of an electrical alarm circuit coupled to said conductive screen and a sheet conductor making electrical contact through said board with said wiring pattern on the board registering with said test jig.

14. Test equipment as defined in claim 7, wherein said means placing the test jig and wiring board in registration comprises a framework holding the test jig and wiring board slightly separated and a cylindrical roller which urges the test jig and wiring board into physical contact substantially along a straight line.

15. Test equipment as defined in claim 7, wherein said conductive pattern on said test jig comprises a thin conductor sheet having thicker conductive surface pattern fingers thereon corresponding to the voids between the conductor wire pattern on said board.

* * * * *